PRESSURE SUPPORT RESONATOR MOUNTING

Filed April 19, 1968 2 Sheets-Sheet 1

INVENTORS
CHARLES DALE CLAWSON
ARTHUR HARLEY CLAWSON, JR.
BY Robert Levine
ATTORNEY

INVENTORS
CHARLES DALE CLAWSON
ARTHUR HARLEY CLAWSON, JR.
BY
ATTORNEY 3,535,569

PRESSURE SUPPORT RESONATOR MOUNTING

Charles Dale Clawson and Arthur Harley Clawson, Jr., Attica, Ind., assignors to P. R. Mallory & Co., Inc., Indianapolis, Ind., a corporation of Delaware Filed Apr. 19, 1968, Ser. No. 722,745
Int. Cl. H01v 7/00
U.S. Cl. 310—9.2 12 Claims

ABSTRACT OF THE DISCLOSURE

Piezo-electric mounting and supporting means have been constructed so as to pressure support resonators therein and to mount the same singly and in multiple in one enclosure. The enclosed units thus have universal application in circuits using resonators operating at different frequencies, with each resonator being decoupled from any other resonator in the enclosure.

This invention relates to frequency selective devices and more particularly to piezo-electric resonators and the methods and means for effectively mounting the same in desired electronic configurations.

Piezo-electric resonator elements utilized in electronic circuits are critical in their mode of mounting. If improperly coupled to the circuitry, losses are obtained which greatly mitigate in the overall gain and output characteristics thereof. It is important, therefore, that mounting or holding devices for these elements be such as to obviate these losses. Also, it is important that the costs necessary for production be maintained as low as possible. Since these devices are of miniature size, efficient manufacture is greatly dependent upon the mounting utilized in supporting the resonator for interconnecting with the other components of the associated circuitry.

It is the general object of the present invention to provide a piezo-electric resonator on a mounting support characterized by overcoming the problems critical in prior art devices.

Another object of the present invention is to provide a piezo-electric resonator having improved operating characteristics as coupled to amplifiers.

Still another object of the present invention is to provide wide band amplification for (I.F.) intermediate frequency piezo-electric amplifiers.

Another object of the present invention is to provide a broad band amplifier for miniaturized radio circuits.

A still further object of the present invention is the provision of piezo-electric resonators characterized as above which are relatively simple in construction, easy to fabricate and low in cost.

These and further objects, the several advantages of the invention, and the manner in which these objects and advantages are obtained will be apparent to those conversant with the art from the following description and subjoined claims taken in conjunction with the annexed drawing in which:

Generally speaking, the present invention describes a novel piezo-electric resonator which is mounted either singly or in multiple in circuits formerly necessitating complicated wire wound transformers and/or resonators. In addition, the resonators are included in a unique fashion in circuits which formerly used resonators at fixed frequencies, both in their anti-resonant and resonant circuits. In the present invention, there is the use of the resonators in a staggered tuning relationship, and wherein the physical mounting of the resonators becomes increasingly important in obtaining optimum band-width and gain for the amplifier.

Figure 1:
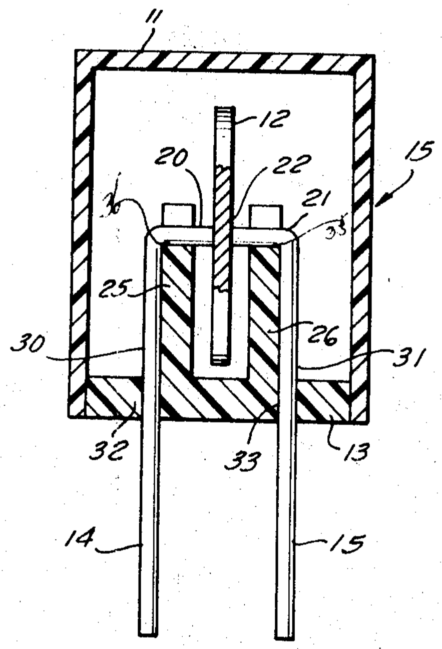
FIG. 1 is a cross-sectional view of an encapsulated mounting for a single piezo-electric resonator.
Figure 2:
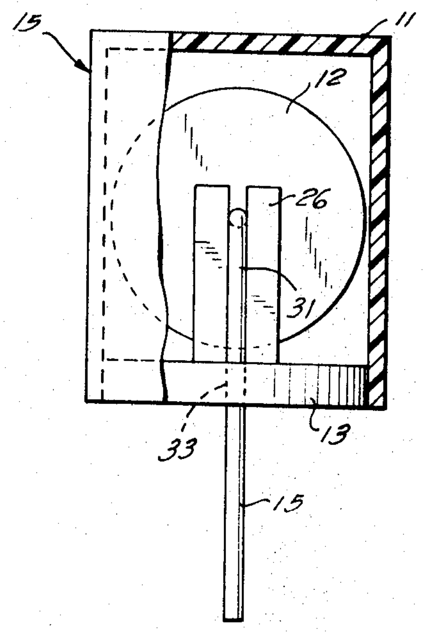
FIG. 2 is a side view of an encapsulated mounting for a single piezo-electric resonator and FIG. 2*a* is a top view thereof.

Referring now to FIGS. 1 and 2 of the drawing, there is shown, a piezo-electric resonator 12 which is mounted and coupled to a pair of leads 14, 15 for connection in an electric circuit, such as an amplifier. As is shown, the resonator disc, per se, may be physically disposed above the base 13 of the mount by two fingers of a pair of leads bent at approximate right angles thereto. The disc is maintained therein by pressure contact at the node point thereof. The amount of pressure at the node point is such that the resonator disc is firmly held therebetween. The disc, however, may be rotated within the pressure grip of the fingers 20, 21 coupled to the disc at the node 22 and allowed to vibrate freely in its radial mode.

In order to obtain the necessary support and pressure coupling for the resonator disc, circular base 13, has a pair of stanchions integrally formed as vertical uprights 25, 26 thereto. Leads 14, 15 have main portions or legs 30, 31 pass through apertures 32, 33 of the base. At the top of stanchions 25, 26, there are formed apertures 35, 36 through which pass fingers 20, 21 integrally formed of leads 14, 15 but bent at approximately 90° to portions 30 and 31, thereof. The entire lead structure is made of Phosphor bronze material or any spring material and has a stress and strength characteristic enabling its arms 20, 21 to bear up against resonator 12 at its nodel point which is the exact center thereof to fixedly yet rotatably be maintained by pressure. This centered coupling to the leads gives a free floating characteristic and allows the disc to vibrate freely in its radial node absent from other mounting arrangements and obviates the necessity for soldering or other connections to the resonator disc.

Figure 3:
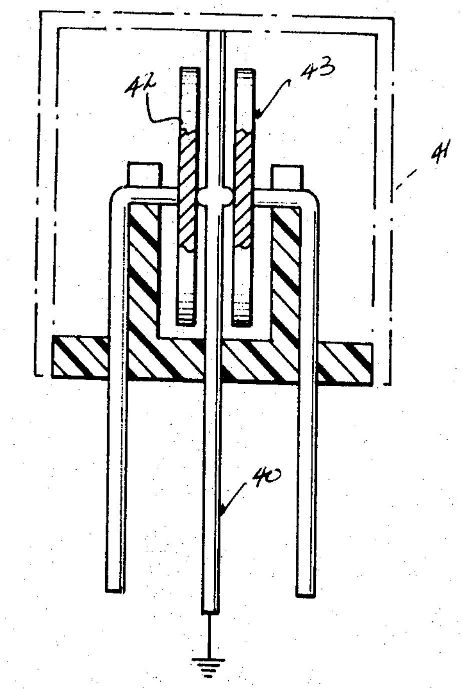
FIG. 3 is a sectional view of a centered coupling resonator holder for mounting in a double resonator construction, and as indicated for including in a circuit, shown here as a staggered tuning circuit.
Figure 2A:
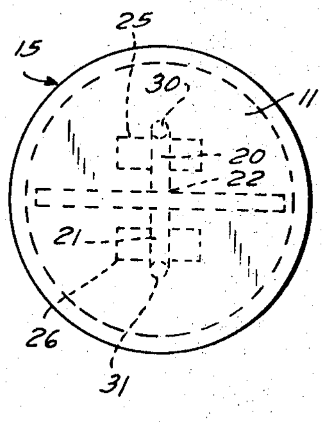

By referring to FIG. 3 of the drawing, the mounting for multiple discs is obtained by providing a third terminal lead 40 and shield 41 which has dimples therein to make connections on either side of an associated disc. This sort of coupling allows individual and single coupling of the elements while reducing the space requirements to such an extent that a single envelope or container may be used to encompass a multiplicity of units. It is apparent that such an arrangement reduces the costs of production and more particularly is especially useful in miniaturized circuit arrangements necessary in transistorized circuitry. Moreover, the adaptability of such an arrangement is such that either one or two or more discs are readily available for automated operation and assembly. Especially is this so when the leads are fabricated so as to determine a polar frequency arrangement of the discs within an encapsulated base structure. In such an arrangement, too, the mid-terminal 40 and shield 41 acts as a decoupler spacer and isolates one resonator 42 from the other 43.

Figure 4:
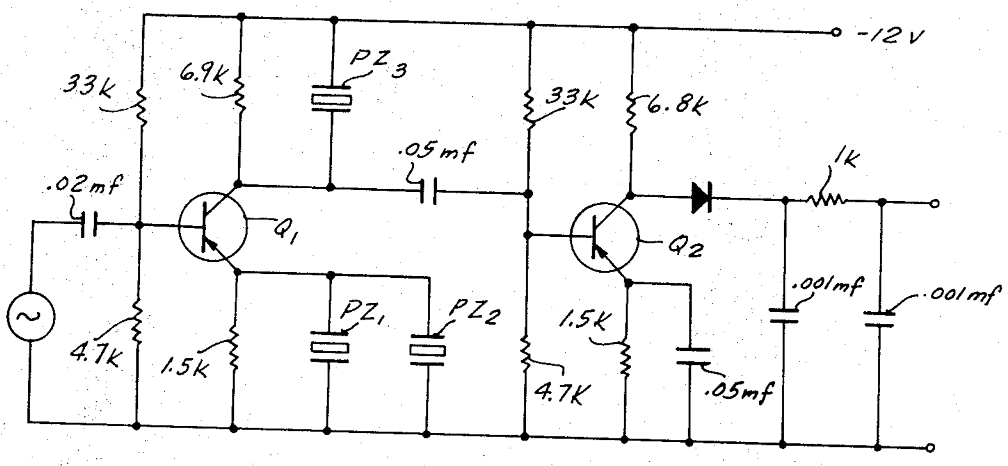
FIG. 4 is illustrative of a simplified circuit wherein the present resonator has application and shows an embodiment of an actual piezo-electric amplifier in which the resonator has found particular application.
Figure 5A:
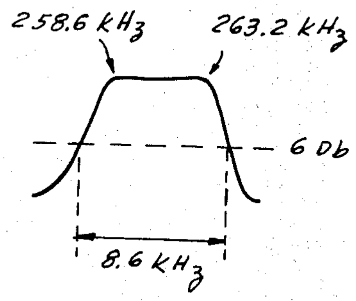
FIG. 5*a* and 5*b* are frequency response curves obtainable from the circuit shown in FIG. 4.
Figure 5B:
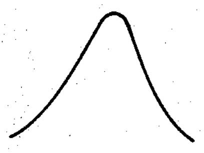
Figure 5C:
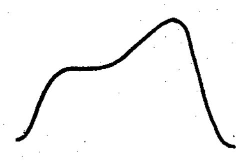

In FIG. 4, there is shown a circuit for obtaining wide band amplification through the use of staggered tuning resonance discs. The circuit is transistorized and uses one or two parallel piezo-electric units in the emitter circuit of transistor Q, and one piezo-electric resonator within the collector circuit thereof. Resonators for use in emitter circuit are selected according to their resonant frequency (this is the frequency at which resonator impedance approaches zero ohms) and resonators for use in collector circuit are selected according to their antiresonant frequency (this is the frequency at which resonator impedance approaches infinity ohms). It was found that the circuit is very selective if only a single piezo-electric unit is employed in the emitter circuit. However, by adding an additional resonator to the collector circuit as shown above, the gain for the stage can be increased and the band-width can be widened. By adding a second piezo-electric unit to the emitter of the transistor, a flat top response curve as shown in FIG. 5 is obtained. It is found, too, that various response curves are obtained by using different series and parallel combinations in the emitter and collector circuits. For example, if two units operating at substantially the same resonant frequency are used in the emitter circuit, and a unit of lower antiresonant frequency is used in the collector circuit, then a flat top response curve of FIG. 5A is obtained. If, the collector unit is removed, the curve shown in FIG. 5B is obtained with concomitant lower stage gain. If, only one emitter resonator and one collector resonator are used, then a humped curve as shown in FIG. 5C is obtained where the peak gain is the same as is for that using three units, but the low frequencies are attenuated. It was determined, that the high frequency side of the response curve is controlled by the resonant frequency of the emitter units. Thus, in order to obtain a center frequency of 262.5 kHz. the resonant frequency of the emitter units will have to be higher and in the order of 266 kHz.

The wide band intermediate frequency amplifier shown in FIG. 5 is designed to have a wide band I.F. of frequency of 8.6 kHz. at 6 db down, with a mean frequency of approximately 262 kHz. The input frequency to the first stage of amplification is directed to the transistor designated as 2N396 through a .02 capacitor. As seen, the resonators are placed in parallel. The frequency band output from said amplification stage is dependent upon the staggered frequency relationship of the resonators visavis each other together with the number of positioned resonators in the separate emitter and collector circuits of the amplifier.

The description of the piezo-electric unit and amplifier, as above, is believed to be merely illustrative and the scope of the invention is to be determined by the appended claims herein.

What is claimed is:

1. A mounting means useful for supporting a piezo-electric resonator comprising
- a base,
- a pair of upright members supported by said base for receiving a resonator therebetween, and
- abutting means, cooperatively associated with said upright members, for mounting a resonator on said base by pressure contact at the vibration node thereof whereby the resonator is free to vibrate in its radial node.

2. A mounting means according to claim 1, wherein said abutting means is positioned by said upright members.

3. A mounting means according to claim 2, wherein said abutting means includes a pair of conductive leads having finger portions for contacting the resonator by pressure contact.

4. A mounting means according to claim 3, wherein said finger portions extend from said leads at substantially right angles thereto.

5. A mounting means according to claim 4, wherein each of said leads penetrates said base and the finger portion thereof penetrates said upright member and provides electrical contact to the resonator.

6. A mounting means according to claim 5, wherein said upright members are integrally molded to said base.

7. A mounting means according to claim 6 further including a cap means positioned around said base for enclosing said upright members, said finger portions of said conductive leads and the resonator.

8. A mounting means according to claim 1, wherein at least three upright members are supported by said base for receiving at least two resonators therebetween with one of said upright members positioned between the two resonators and providing a spacer means therebetween

9. A mounting means according to claim 8, wherein said abutting means includes a pair of conductive leads having finger portions extending therefrom and a pair of dimple means on each side of said upright spacer means, said finger portions and said dimple means contacting the resonators by pressure contact, and said upright spacer means providing a conductive lead for decoupling the resonators.

10. A mounting means according to claim 9, wherein said finger portions extend from said leads at substantially right angles thereto.

11. A mounting means according to claim 10, wherein each of said leads penetrates said base and each of the finger portions of said pair of conductive leads penetrate an upright member positioned on oppositely opposed sides of the resonators.

12. A mounting means according to claim 11 further including a cap means positioned around said base for enclosing said upright members, said finger portions of said conductive leads, said dimple means of said upright spacer means and the resonators.

References Cited

UNITED STATES PATENTS

| | | | |
|---|---|---|---|
| 2,806,966 | 9/1957 | Silver | 310—9.1 |
| 2,820,911 | 1/1958 | Klingsporn | 310—9.1 |
| 2,830,203 | 4/1958 | Potter | 310—9.1 |
| 3,046,423 | 7/1962 | Wolfskill | 310—9.1 |
| 3,054,915 | 9/1962 | Houck | 310—9.1 |
| 3,221,189 | 11/1965 | Brandt | 310—9.1 |
| 3,340,410 | 9/1967 | Sanford | 310—9.1 |
| 3,370,188 | 2/1968 | Blomster | 310—9.1 |
| 3,423,700 | 1/1969 | Curran | 310—9.1 |
| 3,403,358 | 9/1968 | Kolm | 333—72 |
| 3,327,254 | 6/1967 | Farace | 333—72 |
| 2,429,414 | 10/1947 | Kuenstlev | 310—9.2 XR |

MILTON O. HIRSHFIELD, Primary Examiner

B. A. REYNOLDS, Assistant Examiner

U.S. Cl. X.R.

310—9.7